United States Patent [19]
Yee et al.

[11] Patent Number: 5,235,202
[45] Date of Patent: Aug. 10, 1993

[54] RADIATION HARDENED FIELD DIELECTRIC UTILIZING BPSG

[75] Inventors: Abraham F. Yee, Santa Clara; Roger T. Szeto, San Jose; Alex Hui, Palo Alto, all of Calif.

[73] Assignee: LSI Logic Corporation, Milpitas, Calif.

[21] Appl. No.: 601,598

[22] Filed: Oct. 18, 1990

Related U.S. Application Data

[63] Continuation of Ser. No. 240,979, Sep. 6, 1988, abandoned.

[51] Int. Cl.[5] .............................................. H01L 29/78
[52] U.S. Cl. .................................... 257/394; 257/372; 257/644; 257/650
[58] Field of Search ............. 357/54, 71, 23.13, 23.15, 357/65, 59; 257/372, 394, 650, 644

[56] References Cited

U.S. PATENT DOCUMENTS 4,291,322  9/1981  Clemens et al. ...................... 357/71
4,807,016  2/1989  Douglas ................................. 357/71

Primary Examiner—Robert J. Pascal
Assistant Examiner—R. Ratliff
Attorney, Agent, or Firm—Skjerven, Morrill, MacPherson, Franklin & Friel

[57] ABSTRACT

A radiation hardened MOSFET is fabricated by forming a dielectric layer of boro-phosphosilicate glass (BPSG) over the field oxide layer of the MOSFET. The BPSG covers only a small part of the gate electrode of the MOSFET. The gate electrode of the MOSFET is formed from two layers of polycrystalline silicon so as to prevent contamination of the gate oxide by the BPSG dopants.

10 Claims, 3 Drawing Sheets

RADIATION HARDENED FIELD DIELECTRIC UTILIZING BPSG

This application is a continuation of application Ser. No. 07/240,979, filed Sep. 6, 1988, now abandoned.

FIELD OF THE INVENTION

This invention relates to manufacture of semiconductor devices and in particular to an improved method and means for making MOS circuits radiation tolerant.

BACKGROUND OF THE INVENTION

Presently known MOSFET (metal oxide semiconductor field effect transistor) devices incorporate a grown thick field oxide layer which serves to reduce the occurrence of radiation induced field inversion. The undesirable field inversion is known to result in high leakage current with a consequent failure of the MOS circuits. In prior art MOS structures, the oxide layers have a high cross-section for trapping holes generated during irradiation. Radiation may arise from the presence of cosmic rays or nuclear reactions whereby high energy particles penetrate the oxide layers. In such case, the field oxide charges become positive so that the field inverts thereby resulting in parasitic transistor action with high leakage current and device failure.

To solve this problem, dielectric layers, such as undoped oxides deposited by chemical vapor deposition, and also layers using phosphosilicate glass (PSG) oxide were used to reduce the amount of charge trapping. For the manufacture of radiation hard integrated circuits, of the high performance CMOS types for example, it is highly desirable to minimize field inversion and the resultant high leakage current effects so that failure of the MOS circuits will not occur.

SUMMARY OF THE INVENTION

An object of this invention is to provide a method of manufacturing a MOSFET device whereby the radiation resistance of the field oxide is substantially improved.

Another object of this invention is to provide an oxide isolation process that substantially reduces induced field inversion in MOS circuits.

Another object is to reduce the failure rate of MOS circuits.

A further object is to provide a radiation hard integrated circuit.

According to this invention, during the process of forming a MOSFET, a radiation hard field dielectric is formed over the field oxide layer of the MOSFET device. The dielectric is formed of a hard material of borophosphosilicate glass (BPSG) that is effectively resistant to radiation and thus protects the field oxide from the effects of irradiation. The BPSG layer is in the shape of an island that is notched. Two layers of polycrystalline silicon are used to form a gate so as to prevent contamination of the gate oxide by the BPSG dopants.

The key problem to overcome in the utilization of a BPSG dielectric layer is dopant out-diffusion from the BPSG into the silicon surface region under the gate. This is accomplished in the present invention by using a double polycrystalline silicon process whereby the gate oxide is grown prior to BPSG deposition and the first polycrystalline silicon layer both protects the gate oxide and acts as a channel stop for the BPSG etch step.

DESCRIPTION OF THE DRAWINGS

The invention will be described with reference to the drawings in which:

FIG. 8 is a top plan view of the completed structure of FIGS. 7 and 8.

Similar numerals refer to similar elements throughout the drawing.

DETAILED DESCRIPTION OF THE INVENTION

Figure 1:
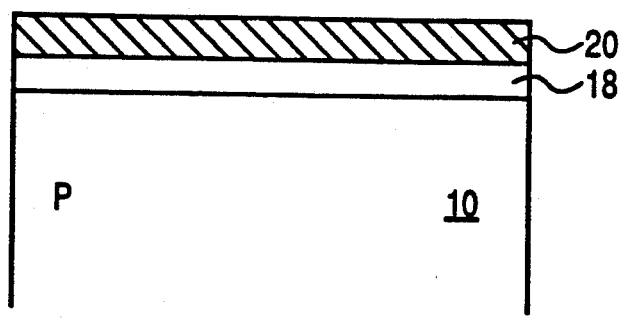
FIGS. 1-7 are cross-section representations depicting steps in the process of making a MOSFET device in accordance with the invention.

With reference to FIG. 1, a substrate 10 consists preferably of a single crystal silicon wafer which has formed on it by conventional means a layer of P conductivity type. The surface of the substrate 10 then is cleaned and subjected to an initial oxidation to produce a thin layer of silicon oxide 18 on the surface. The thickness of the silicon oxide layer 18, which is substantially uniform across the surface, is typically about 200–500Å. The thin layer of silicon oxide 18 will later serve as a gate oxide layer A first layer of conductive material such as polycrystalline silicon 20 is then deposited over the silicon dioxide layer 18. The polycrystalline silicon layer 20 is deposited using conventional methods and is about 200 to 1000Å thick. Other conductive materials suitable for layer 20 include tungsten or other refractory metals.

Figure 2:
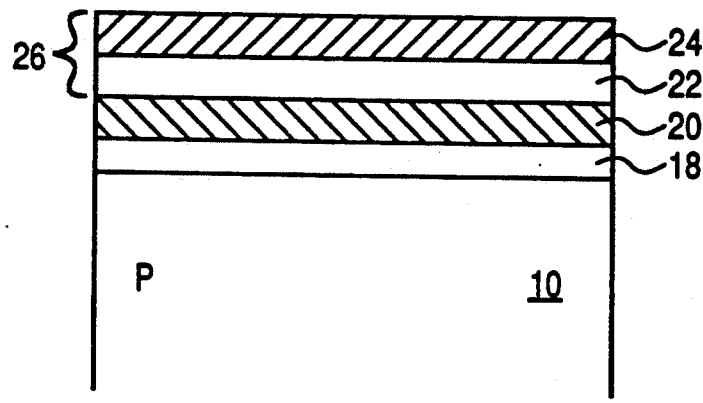

A layer of silicon dioxide 22 is then deposited on top of polycrystalline silicon layer 20. (FIG. 2) Silicon dioxide layer 22 is deposited to a thickness of about 300–800Å using CVD or is thermally grown by conventional methods. A layer of silicon nitride 24 is then deposited over the silicon dioxide layer 22 by conventional chemical deposition means thus forming an oxide-nitride "stack" 26.

Figure 3:
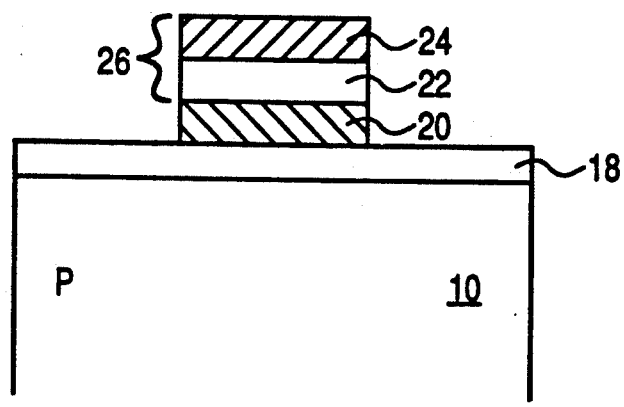

By means of conventional masking and photolithographic methods, an "island," typically rectangular in shape, is defined in the nitride-oxide stack 26 and the first polycrystalline silicon layer 20. The nitride-oxide stack 26 and the first polycrystalline silicon layer 20 are then etched to form an island as shown in FIG. 3. The etching is performed by a conventional chemical dry etch process.

Figure 4:
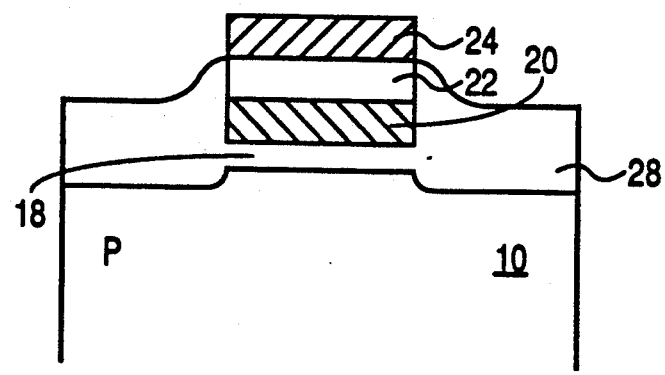

Next, the substrate and the various layers on it are subject to thermal oxidation in a steam atmosphere at 850°–950° C. so as to form a second silicon dioxide layer 28 as shown in FIG. 4. Silicon dioxide layer 28 is about 1000 to 2000Å thick.

Figure 5:
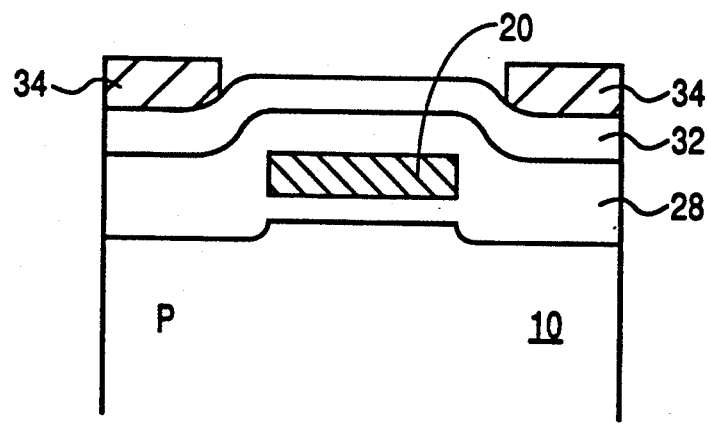

Then the nitride layer 24 is removed by chemical or dry etching. Next, a layer of boro-phosphosilicate glass (BPSG) 32 is deposited over the second silicon dioxide layer 28 as shown in FIG. 5. The BPSG layer 32 is deposited at 350° to 500° C. by flowing a mixture of silane ($SiH_4$) gas, oxygen, phosphine ($PH_3$) gas, and boron trichloride ($BCl_3$) or diborane ($B_2H_6$) gas over the surface of oxide layer 28. The flow rates are: $SiH_4$ 50 to 200 sccm; $O_2$ 50 to 200 sccm; $PH_3$ 1 to 20 sccm; and $BCl_3$ (or $B_2H_6$) 1 to 20 sccm, at a pressure of 100 to 300 millitorr. The resulting BPSG glass layer 32 is about 2% to 8% boron and about 2% to 8% phosphorous by weight and the remainder is silicon dioxide, and has a thickness of about 2000Å to 5000Å.

Figure 6:
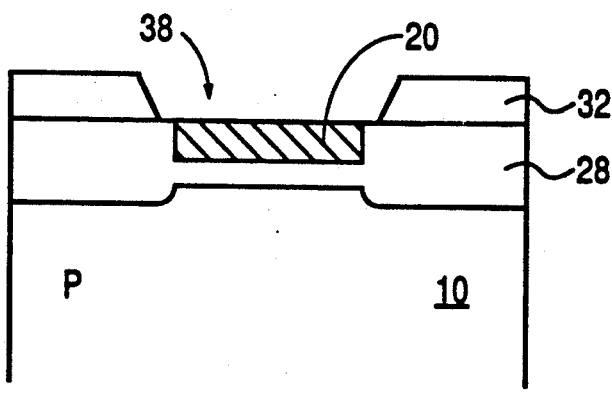

Next, a masking layer of photoresist 34 is formed by conventional means over BPSG layer 32, leaving a portion of the BPSG layer 32 exposed. This mask layer 34 protects the underlying layers, while the exposed portion of BPSG layer 32 is etched away by a buffered oxide etch. A portion of the second oxide layer 28 is also etched away in the process. This etching leaves almost all of polycrystalline silicon layer 20 exposed as defined by the mask layer 34, as shown in FIG. 6. Mask layer 34 (FIG. 5) is shaped so as to leave two "notches" in the otherwise etched-away BPSG area 38. Mask layer 34 is then removed, leaving the structure as shown in FIG. 6.

Figure 7:
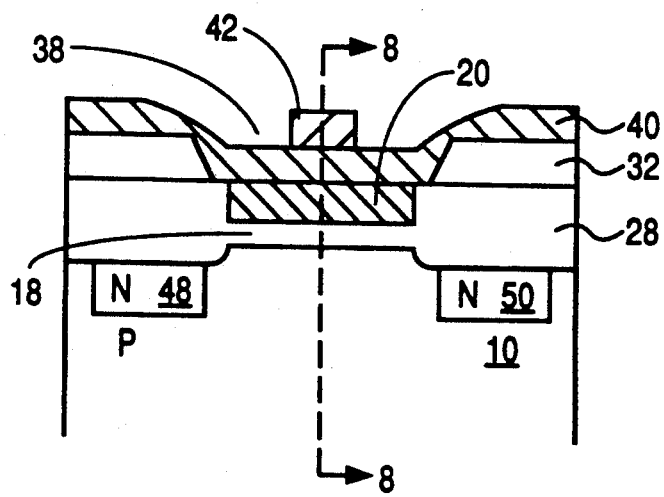

Next, as shown in FIG. 7 a second layer of polycrystalline silicon 40 or other conductive material is deposited, by the same means as the first polycrystalline silicon layer 20. This second polycrystalline silicon layer 40 has a thickness of about 3000 to 6000Å.

Figure 8:
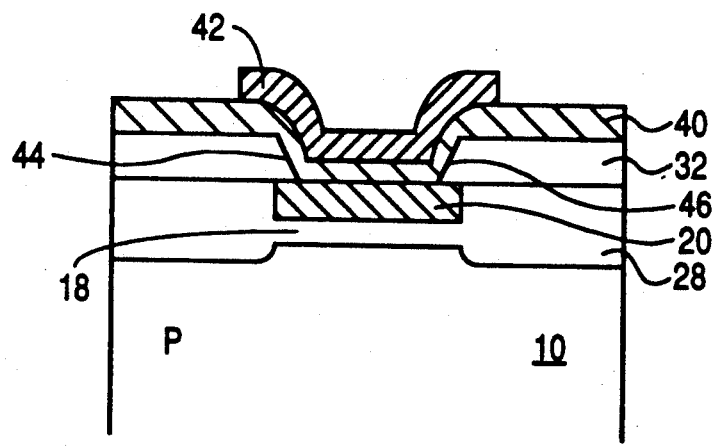
FIG. 8 is a cross-section representation of the structure in FIG. 7, along line A—A, to aid in the explanation of the invention.
Figure 9:
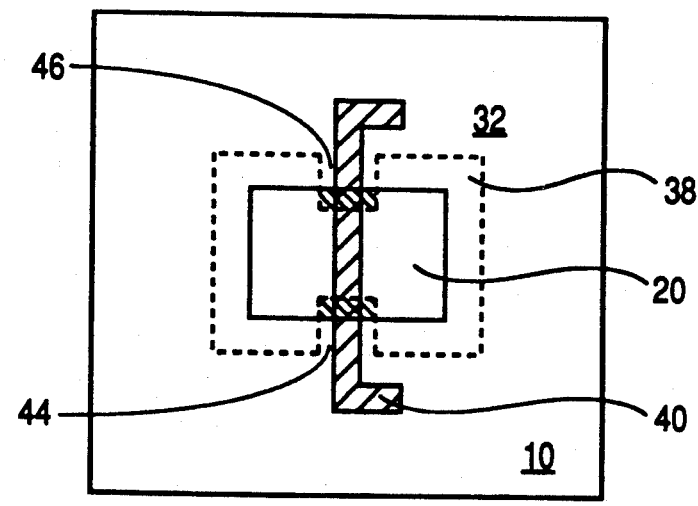

Next, the second polycrystalline silicon layer 40 is masked by mask layer 42 as shown in FIGS. 7 and 8 and etched by conventional means (such as an $SF_6$-$O_2$ etch), so that the second polycrystalline silicon layer 40 has a shape in top view as shown in FIG. 9. As seen in FIG. 9, BPSG etched-away area 38 is rectangular in shape, with two notches 44,46 formed in it. Notches 44, 46 are shown in FIG. 8. The second polycrystalline silicon layer 40 overlies the BPSG etched-away area 38 and crosses the notches 44,46.

In terms of function, the first oxide layer 18 is a gate oxide layer as shown in FIG. 7. The first polycrystalline silicon layer 20 is completely removed during the second polycrystalline silicon etch except in the area covered by the second polycrystalline silicon layer 40 and the notch areas 44, 46 (see FIG. 9) covered by the BPSG layer 32. This first polycrystalline silicon layer 20 serves as the gate to control the field effect device between the source region 48 and drain region 50. The second polycrystalline silicon layer 40, as shown in FIG. 8, is partly underlain by the BPSG layer 32 to prevent current leakage between adjacent transistors in the substrate. The BPSG layer 32 covers the field oxide (that part of the oxide layer 28 on either side of the gate oxide 18).

To complete the semiconductor device, N type source 48 and drain 50 self aligned semiconductor regions are formed by conventional methods as shown in FIG. 7, and electrical contacts are opened as is well known in the art to the source 48 and drain 50 regions, and electrical contact is made to the source 48, drain 50, and gate 42 by means of metallization electrical interconnections (not shown).

A preferred embodiment has been illustrated, of which modification and adaptations within the scope of the invention will occur to those skilled in the art. For instance, the notches in the etched-away BPSG area could be dispensed with. The invention is limited only by the scope of the following claims.

We claim:

1. A semiconductor device comprising:
   a semiconductor body of a first conductivity type;
   a semiconductor region of a second conductivity type opposite the first type formed in the semiconductor body;
   a gate oxide layer on a surface of the semiconductor body;
   a conductive gate electrode on the gate oxide layer; and
   a layer of boro-phosphosilicate glass over the oxide layer, and over and in contact with a first portion of the gate electrode, wherein a second portion of the gate electrode overlies the layer of glass.

2. The device of claim 1, wherein the gate electrode is polycrystalline silicon.

3. The device of claim 1, wherein the gate electrode is rectangular in shape in the plane of the surface of the semiconductor body.

4. The device of claim 1, wherein the glass layer is 2% to 8% boron by weight and 2% to 8% phosphorous by weight.

5. The device of claim 4, wherein the glass layer has a thickness of at least 1000Å.

6. The device of claim 1, further comprising:
   a second semiconductor region of the second conductivity type formed in the semiconductor body and spaced apart from the first semiconductor region, whereby the first and second semiconductor regions are respectively a source and a drain of a MOSFET transistor, and the gate electrode is the gate electrode of the MOSFET transistor.

7. The device of claim 1, wherein both portions of the gate electrode comprise polycrystalline silicon.

8. A radiation-hardened semiconductor device comprising:
   a semiconductor body of a first conductivity type and having a principal surface;
   a semiconductor region of a second conductivity type opposite the first type formed in the body and extending to the principal surface thereof;
   an insulating layer formed on said principal surface and overlying said semiconductor region;
   a first portion of a gate electrode formed on said insulating layer, and having at least two parallel opposing edges in a plane defined by the principal surface;
   a layer of boro-phosphosilicate glass formed on said insulating layer surrounding the first portion of the gate electrode in the plane defined by the principal surface and laterally spaced apart from the first portion of the gate electrode except for a part of the layer of glass covering only two areas of the first portion of the gate electrode, the two covered areas being located respectively at the two parallel opposing edges of the gate electrode, thereby forming a notched island protecting the underlying insulating layer from radiation; and
   a second portion of the gate electrode overlying and contacting a central part of the first portion thereof extending between the two covered areas, and also overlying the two covered areas and being insulated therefrom by the layer of glass.

9. A radiation-hardened semiconductor device comprising:
   a semiconductor body of a first conductivity type and having a principal surface;
   a semiconductor region of a second conductivity type opposite the first type formed in the body and extending to the principal surface thereof;
   a first insulating layer formed on said principal surface and overlying said semiconductor region;
   a first portion of a gate electrode formed on said insulating layer, and having a rectangular shape defining two parallel opposing edges in a plane defined by the principal surface;

a second insulating layer formed on said first insulating layer and laterally surrounding said first portion of the gate electrode;

a layer of boro-phosphosilicate glass formed on said second insulating layer and surrounding the first portion of the gate electrode in the plane defined by the principal surface and laterally spaced apart from the first portion of the gate electrode, except for a part of the layer of glass covering only and in contact with only two rectangular areas of the first portion of the gate electrode, the layer of glass not covering a central part of the first portion of the gate electrode, the two covered areas being located respectively at the two parallel opposing edges of the gate electrode, the glass layer defining a notched island and protecting the underlying first and second insulating layers from radiation except in the area of the notched island; and a second portion of the gate electrode overlying and contacting a central part of the first portion thereof extending between the two covered areas, and also overlaying the layer of glass and overlying parts of the two covered areas and being insulated from the two covered areas by the layer of glass.

10. A semiconductor device comprising:

a semiconductor body of a first conductivity type and having a principal surface;

a semiconductor region of a second conductivity type opposite the first type formed in the body and extending to the principal surface thereof;

an insulating layer formed on said principal surface and overlying said semiconductor region;

a first portion of a gate electrode formed on said insulating layer, and having at least two opposing edges in a plane defined by the principal surface;

a layer of boro-phosphosilicate glass formed on said insulating layer and covering only and in contact with only two areas of the first portion of the gate electrode, the layer of glass not covering a central part of the first portion of the gate electrode, the two covered areas being respectively at the two opposing edges of the gate electrode; and a second portion of the gate electrode overlying and contacting first portion thereof, and also overlying the two areas and being insulated therefrom by the layer of glass.

* * * * *